(12) United States Patent
De Buys

(10) Patent No.: US 7,498,957 B2
(45) Date of Patent: Mar. 3, 2009

(54) JITTER-FREE SAMPLE RATE CONVERSION

(75) Inventor: Frans Victor Felix De Buys, Leuven (BE)

(73) Assignee: NXP B.V., Eindhoven (NL)

(*) Notice: Subject to any disclaimer, the term of this patent is extended or adjusted under 35 U.S.C. 154(b) by 49 days.

(21) Appl. No.: 11/631,401

(22) PCT Filed: Jun. 23, 2005

(86) PCT No.: PCT/IB2005/052074
§ 371 (c)(1),
(2), (4) Date: Dec. 29, 2006

(87) PCT Pub. No.: WO2006/003567
PCT Pub. Date: Jan. 12, 2006

(65) Prior Publication Data
US 2008/0055123 A1    Mar. 6, 2008

(30) Foreign Application Priority Data
Jun. 29, 2004    (EP)    ................... 04103017

(51) Int. Cl.
*H03M 7/00*    (2006.01)

(52) U.S. Cl. .................................. 341/61; 375/240.01
(58) Field of Classification Search ................... 341/61; 375/371, 240.01
See application file for complete search history.

(56) References Cited

U.S. PATENT DOCUMENTS

| | | | |
|---|---|---|---|
| 5,828,414 A * | 10/1998 | Perkins et al. | ......... 375/240.01 |
| 6,169,767 B1 | 1/2001 | Strolle | |
| 6,411,225 B1 * | 6/2002 | Van Den Enden et al. | ..... 341/61 |
| 6,611,215 B2 * | 8/2003 | Miller et al. | ................... 341/61 |
| 2002/0172310 A1 * | 11/2002 | Thamsirianunt et al. | .... 375/371 |

* cited by examiner

*Primary Examiner*—Rexford Barnie
*Assistant Examiner*—Joseph Lauture

(57) ABSTRACT

A method and apparatus are described for asynchronous sample rate conversion, in particular those which use an interpolating filter, especially a polyphase interpolating filter (FB4). The input and output signals have jitter but the polyphase branch signals have no or reduced jitter due to the operation of a jitter removing means such as a phase locked loop. The jitter is reduced only in the polyphase branch signals. Various methods are described for reducing the jitter.

20 Claims, 7 Drawing Sheets

JITTER-FREE SAMPLE RATE CONVERSION

The present invention relates to devices and methods for asynchronous sample rate conversion, in particular those which use a leveling device in particular a single phase-locked-loop (PLL). In particular the present invention relates to devices and methods for asynchronous sample rate conversion which use an interpolator, especially a polyphase interpolator.

In digital applications, a variety of sampling rates are used. This is especially true in audio. Compact Disk, DAT tapes, NICAM, DVD, DAB and MP3 all use different sampling rates. When two or more systems are linked together, which each have their own master clock, the sampling frequency of one system must be changed and synchronized to match that of the other one (asynchronous sampling rate conversion). This is even the case when you want to link two systems, which use the same sampling rate, but derived from a different master clock.

Sample rate converters are known in the art and are used to convert a digital signal with a first (input) sample rate (sampling frequency) into a digital signal with a second (output) sample rate (sampling frequency). The sample rate can be increased (up-converter) or decreased (down converter). Such sample rate converters are required when processing signals of a system using a first sampling rate in a system, which uses a second sampling rate. For example compact disks use 44.1 kHz, digital audiotapes use 48 kHz and satellite broadcasting uses 32 kHz. If the ratio between the original frequency and the target frequency is not a whole number, it is known to use a very high intermediate conversion frequency.

Sample rate converters (src) are therefore involved with format conversion and are often found close to digital interfaces. Sample rate converters should ideally be free of jitter and their output should be free of distortions generated by jitter. Another function of a sample rate converter can be jitter removal or reduction. The input can be from an external source and the quality of the clock may not be perfect and samples may even be missing. The sample rate converter should be robust enough to deal with these deficiencies.

Sample rate converters (src) may be implemented in hardware, in software running on a processing engine or a combination of the two.

Sample rate converters (src) find application in many digital communication technologies, e.g. audio, video and wireless telephony, for example in software defined radio (SDR). For example, they may be used in professional audio equipment for: mixing, recording, editing, broadcasting, optical disk recordable such as CD-Recordable (CD-R) or DVD-recordable (DVD-R), Digital Speaker Systems (DSS), Digital Compact Cassette recorders (DCC), Digital Audio Tape, (DAT) and MD recorders, Digital amplifiers, Jitter killers.

Depending upon the conversion ratio (N), the src may need to generate interpolated values of the incoming bit stream. One form of sample rate converter is known from U.S. Pat. No. 6,411,225 which makes use of a polyphase filter to generate interpolated values. The overall transfer function $H(z)$ of a received bit stream is broken down into N subfilters $H_n(z^N)$ such that $H(z)$ can be written in the form:

$$H(z) = \sum_{n=0}^{N-1} z^{-n} H_n(z^N)$$ Eq. 1 where N denotes the sample rate conversion ratio. The filters $H_n(z^N)$ may be implemented in the form of an FIR filter or an Nth-band IIR filter.

A known sample rate converter (src) is shown in FIG. 1 which is a high-level block diagram of an src in a system that combines a number of srcs so that M input streams, sampled with M sampling clocks can be converted to M output streams sampled by M other sampling clocks (constituting an SRCS) running on a digital signal processor (DSP). A sample, can be an audio sample or any other kind of sample, e.g. video, medical data, control systems. A sample is part of a stream that needs to be sampling rate converted. At a certain moment such a sample enters the SRC system. In order to do a sampling rate conversion and the arrival time of this sample is noted. On the system there is a fast counter or another type of clock. Whenever a sample enters the system, the value of this clock is noted or sampled. This sampling of the counter will be called a time stamp. Hence, each sample is obtained at a "time stamp". Jittery time stamps are obtained from a mutual clock reference. There are many reasons why any clock pulses received from external will be jittery. A counter will increment at the rate of this mutual clock and every time an arrival or a request for a sample occurs, this counter will be sampled. A PLL on the input clock removes jitter from the time stamps on the input clock. A useful reference for PLL's is the book by R. E. Best, "Phase-Locked Loops" Fifth Edition, McGraw-Hill, 2003 especially, chapter 8 for software PLL's. For a software PLL this process of PLL generation and jitter removal will be executed on an input thread of the src. A second PLL on the output clock will remove jitter from the time stamps on the output clock. This latter process will be executed on the output thread of the src. A synchronization and control block will be executed on the thread with highest sampling rate for this src. This block will amongst other things determine which polyphase branches will have to be calculated in the filter block and which coefficients will have to be used for the linear interpolation. The filter block will partly be executed on the input thread and partly on the output thread of the src. The filter block is steered by the synchronization and control block.

FIG. 2 shows some signals of the block diagram of FIG. 1 in function of the time. Because an SRCS program runs per definition on more than one thread, and because it needs timing information to perform its task, there are lots of possibilities for things to go wrong. Some examples:

The input stream can be interrupted for a short time.
The output stream can be interrupted for a short time.
No relation can be found between the input time stamps and the output time stamps.
The jitter on the time stamps is too high.

It is very important that in case one of the situations above occurs, action is taken. When these situations would not be detected, this could result in a strongly deformed output signal. Fortunately, these situations can easily be detected. Some errors can be detected in the PLL blocks, others can be detected in the synchronization block.

When the SRCS contains only one src, the system will be reinitialized whenever an error is detected. In most of the cases however, the system is implemented in such a way that a number of input streams are converted to output streams on one output sampling clock. To reduce the amount of Mips needed to run the SRCS program, in these cases there is only one output thread for all srcs in the SRCS program. In this way, there is only need for one PLL on the output. The disadvantage of this solution is that in case of an error, the src in which the error is detected cannot simply be reinitialized. This would imply a reinitialization of the output PLL which in turn implies a reinitialization of all the other src's in the system. Unnecessary reinitialization of an src results in distortions in the output signal, e.g. audible clicks in an audio system and is unacceptable. So instead of a reinitialization of the complete system, in these cases it will be necessary to do extensive checks to determine the source of the problem, and then only reinitialize those parts of the system that really need an initialization. This of course could be reinitialization of the complete SRCS after all in some cases. This can be a complicated job that increases in complexity when the number of srcs in a system increases. Indeed, every src in the system has to have knowledge over the other srcs in the system. The result is that the src software has to be tailored to the SRCS it is used in, and that the software is not so easy to reuse and maintain anymore.

An object of the present invention is to provide improved devices and methods for asynchronous sample rate conversion, in particular those which use a single phase-locked-loop (PLL). In particular, it is an object of the present invention to provide devices and methods for asynchronous sample rate conversion which use an interpolator, especially a polyphase interpolator.

The above objective is accomplished by a method and device according to the present invention.

The present invention provides an apparatus for converting an input time discrete signal, such as a digital signal with an input sampling rate to an output signal having an output sampling rate, the conversion ratio being N, the conversion ratio being the ratio of the output to the input sampling rate, the apparatus receiving a jittery input timing signal, comprising:

polyphase filter means receiving the input signal and for outputting samples for the output signal, control means receiving the jittery input timing signal and an output timing signal and for providing the filter means with polyphase branch selector data, and means for reducing jitter only in the polyphase branch selector data. The means for reducing jitter in the polyphase branch selector data includes a phase-locked loop or a low pass filter. The means for reducing jitter in the polyphase branch selector data may include a means for leveling a difference signal between the input timing signal and the output timing signal.

The apparatus may have means for determining, e.g. calculating the conversion ratio from the polyphase branch data. The means for determining, e.g. calculating the conversion ratio N determines, e.g. calculates according to:

$$N = S_{[n]} - S_{[n-1]}$$

and $$S_{[n]} = \frac{C_{B[n]} - C_{A[m]}}{C_{A[m+1]} - C_{A[m]}}$$

where $C_{B[n]} \leq C_{A[m]} \leq C_{B[n+1]}$ and $T_A \geq T_B$ and $C_{X[n]}$ is the time of the nth clock pulse on a clock $C_X$ and $T_X$ is the period of the clock $C_X$. The apparatus may be implemented in software running on a processing engine.

The present invention also provides an apparatus for sample rate converting a number of M input streams, sampled with M sampling clocks to M output streams sampled with M other sampling clocks, the conversion ratio being N, the conversion ratio being the ratio of the output to the input sampling rate, the apparatus receiving at least one jittery input timing signal, comprising:

polyphase filter means receiving an input time discrete signal and for outputting samples for the output signal, control means receiving the jittery input timing signal and an output timing signal and for providing the filter means with polyphase branch selector data, and means for reducing jitter only in the polyphase branch selector data.

The apparatus may be provided by software running on a digital signal processor (DSP). The sample rate conversion of each input stream may be independent of the conversion of all the other conversions. The means for reducing jitter in the polyphase branch selector data may include a phase-locked loop or a low pass filter. The means for reducing jitter in the polyphase branch selector data may include a means for leveling a difference signal between the input timing signal and the output timing signal. The apparatus may have means for determining, e.g. calculating the conversion ratio from the polyphase branch data. The means for determining, e.g. calculating the conversion ratio N may determine, e.g. calculate according to:

$$N = S_{[n]} - S_{[n-1]}$$

and $$S_{[n]} = \frac{C_{B[n]} - C_{A[m]}}{C_{A[m+1]} - C_{A[m]}}$$

where $C_{B[n]} \leq C_{A[m]} \leq C_{B[n+1]}$ and $T_A \geq T_B$ and where $C_{X[n]}$ is the time of the nth clock pulse on a clock $C_X$ and $T_X$ is the period of the clock $C_X$.

The present invention may provide a method of converting an input time discrete signal with an input sampling rate to an output signal having an output sampling rate, the conversion ratio being N, the conversion ratio being the ratio of the output to the input sampling rate, the method comprising:

receiving a jittery input timing signal and an output timing signal, receiving the input time discrete signal, polyphase filtering the input data signal to output samples for the output signal, providing polyphase branch selector data for the polyphase filtering step, and reducing jitter only in the polyphase branch selector data.

The present invention provides a method of sample rate converting a number of M input streams, sampled with M sampling clocks to M output streams sampled with M other sampling clocks, the conversion ratio being N, the conversion ratio being the ratio of the output to the input sampling rate, the method comprising:

receiving at least one jittery input timing signal and at least one output timing signal, receiving an input time discrete signal and polyphase filtering the input signal and outputting samples for the output signal, providing the polyphase filtering step with polyphase branch selector data, receiving the jittery input timing signal and the output timing signal and reducing jitter only in the polyphase branch selector data. The sample rate conversion of each input stream is preferably independent of the conversion of all the other conversions.

An advantage of the present invention is that the Mips count for processing an SRCS is not increased significantly. Further advantages are:

The complexity of the SW system will decrease because different src's in a SRCS are no longer related.

In case of a SRCS with only one src, the Mips count will drop because only one PLL is needed.

In the case of a SRCS with multiple output clocks, the Mips count will drop because less PLLs are needed.

The Mips count of the synchronization block will drop because, since it is now working on jittery data, it is not needed anymore to calculate everything in full precision, e.g. there is a full 24 bits division in this part of the code that can be replaced by a seven or eight bits precision division.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference numbers quoted below refer to the attached drawings.

GLOSSARY

Figure 1:
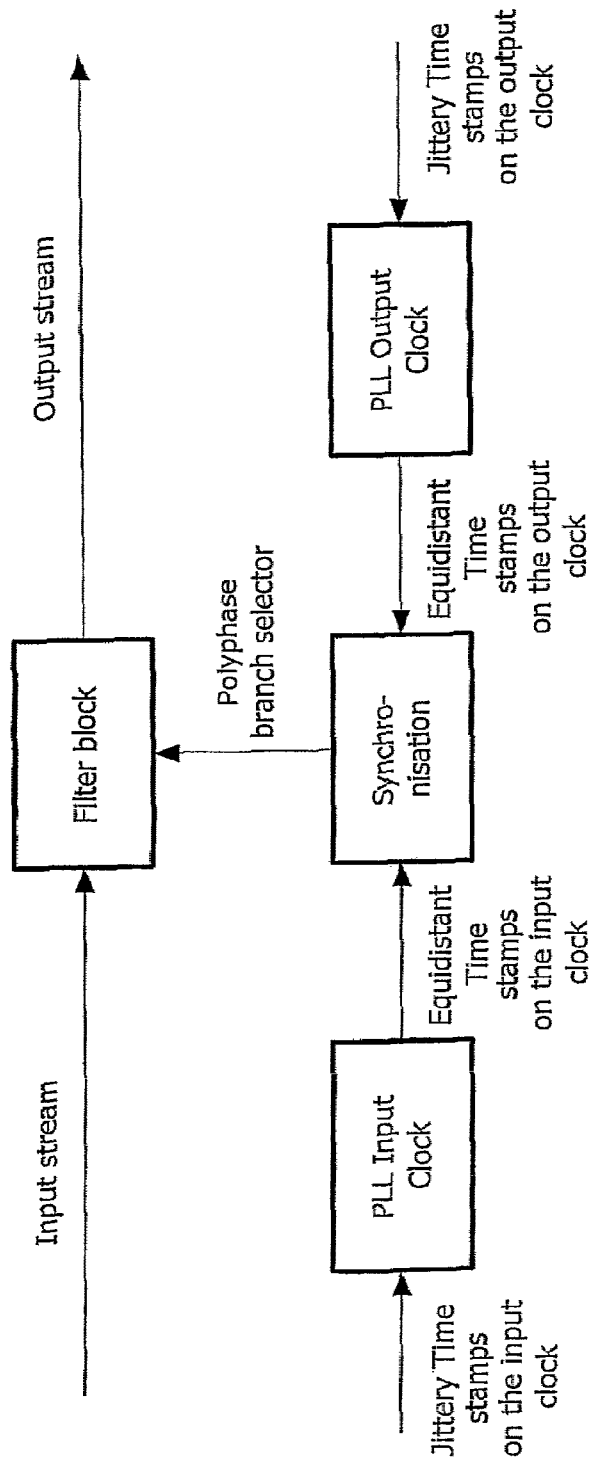
FIG. 1 is a schematic block diagram of a known sample rate converter system (SRCS).
Figure 2:
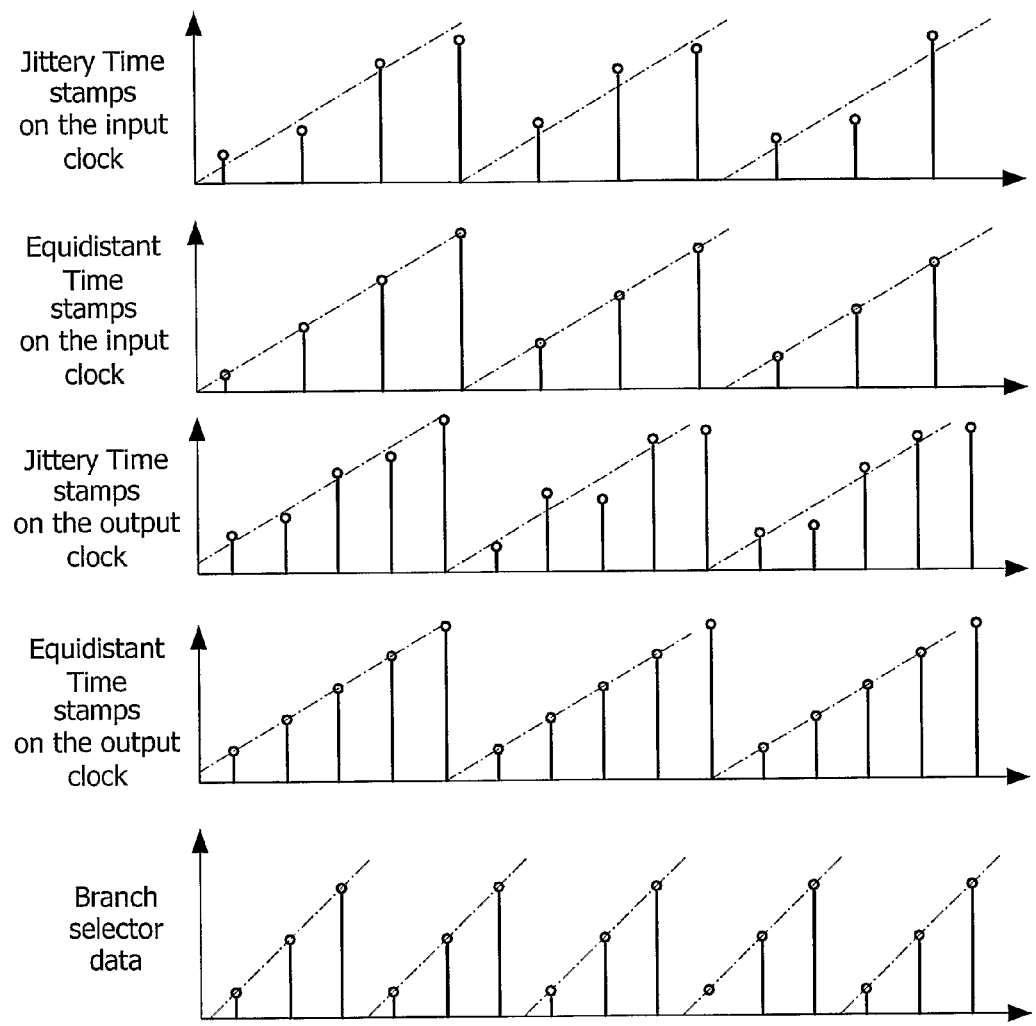
FIG. 2 shows signals in function of time for the system of FIG. 1.

Channel Any kind of communication channel, e.g. a left audio channel, a video channel a wireless telecommunications channel Stream A combination of channels clocked with one clock. e.g. a multi channel audio stream.

Src System that converts an input stream, containing one or more channels and sampled with a certain clock to an output stream with the same amount of channels, but clocked with a different sampling clock.

SRCS System that combines a number of srcs so that N input streams, sampled with N sampling clocks can be converted to N output streams sampled N other sampling clocks.

Thread A piece of program that will be called at a certain rate. Most of the time a thread is associated with a certain stream.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Figure 3A:
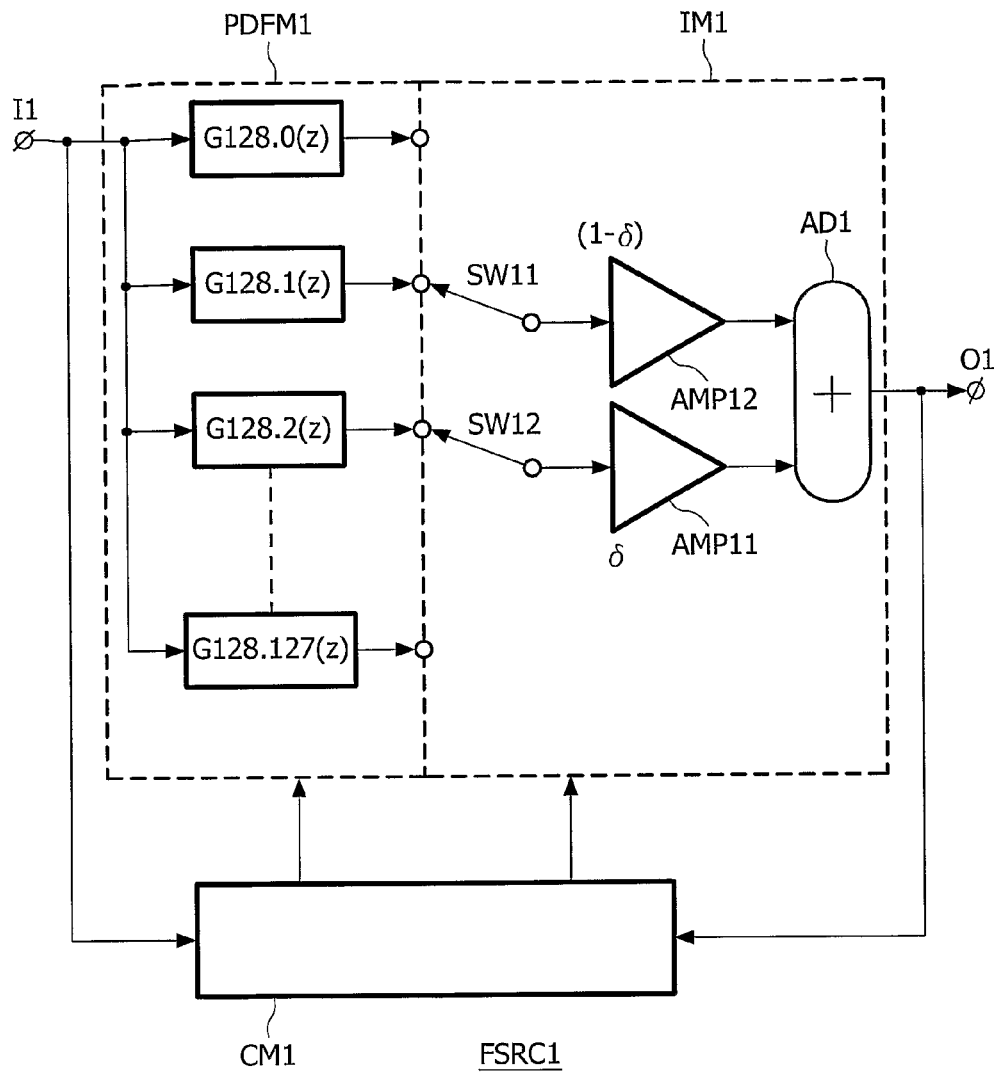
FIGS. 3a, 3b and FIGS. 4a, 4b show two types of sample rate converter, respectively for use with the present invention.

FIG. 3a shows schematically a first example of an asynchronous sample rate converter FSRC1 embodied as an up-converter which can be used with the present invention having an input I1 and an output O1. The present invention relates to asynchronous sampling rate converters which have per definition a flexible ratio, e.g. due to drift, jitter an nominal differences of the system clocks. The present invention makes use of the principles of polyphase decomposition. For example, in the first two stages, an over sampling of respectively of respectively A and B is made, where A can be 2 and B can be 77, for example. The over sampling rates are internal signals at a clock of 2 and 77 Fs. By applying polyphase decomposition the number of computations is reduced by a factor 2 and 77 by doing these calculations on the lower sampling frequency, namely the input sampling frequency.

The sample rate converter can be embodied in software, in hardware or in a combination of the two. The sample rate converter receives a stream of time discrete signals, e.g. digital signals as an input. The sample rate converter comprises, logically, a series-arrangement of polyphase decomposition filter means PDFM1 and interpolation means IM1. The term "logically" implies that the physical arrangement does not need to be one after another in space, e.g. if the converter is implemented in software. Further the sample rate converter comprises control means CM1 that control the operation of the polyphase decomposition filter means PDFM1 and the interpolation means IM1. The sample rate converter FSRC1 may be a flexible sample rate converter. In this context the word "flexible" means that the actual ratio between the input and output sampling frequencies (called the conversion ratio N) does not have to be known in advance. Instead, the required amount of suppression of the images created in the conversion process has to be known. These images may lead to unwanted aliazing. This information and the relative bandwidth are needed to design the interpolating filters.

The polyphase decomposition filter means PDFM1 comprises in this example 128 polyphase branches (G128,0 (z)-G128,127 (z)). In this example the outputs of the polyphase branches are coupled to switches SW11 and SW12 of the interpolation means IM1. The interpolation means further comprises a first and a second amplifier AMP11 and AMP12, whereby the amplifier AMP11 amplifies the received signal with a factor delta and whereby the amplifier AMP12 amplifies the received signal with a factor (1-delta).

The outputs of the amplifiers are coupled to an adder AD1 that supplies the summed signal to the output O1 of the sample rate converter FSRC1. The control means CM1 determines the value of delta. Further the control means determines which pair of samples has to be calculated, in case of linear interpolation. The circuit elements, e.g. switches, control means, interpolator, amplifiers etc. can be implemented in software, hardware or a combination of the two.

Figure 3B:
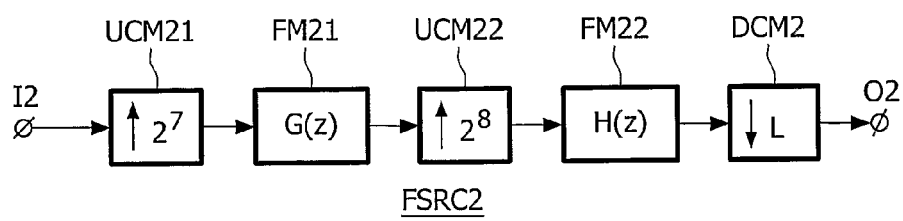

FIG. 3b shows a functional example of an asynchronous sample rate converter FSRC2 which can be used with the present invention as an up-converter. The sample rate converter comprises, logically, in this example, a series-arrangement of first up-conversion means UCM21, first filter means FM21, second up-conversion means UCM22, second filter means FM22 and down conversion means DCM2. The sample rate converter can be embodied in software, in hardware or in a combination of the two. The term "logically" implies that the physical arrangement does not need to be one after another in space, e.g. if the converter is implemented in software. By splitting the up-conversion in two stages with filter means in between the efficiency of the sample rate converter is improved. The transition band of the first filter means can be chosen very narrow and the transition band of the second filter means can be chosen very broadly.

Figure 4A:
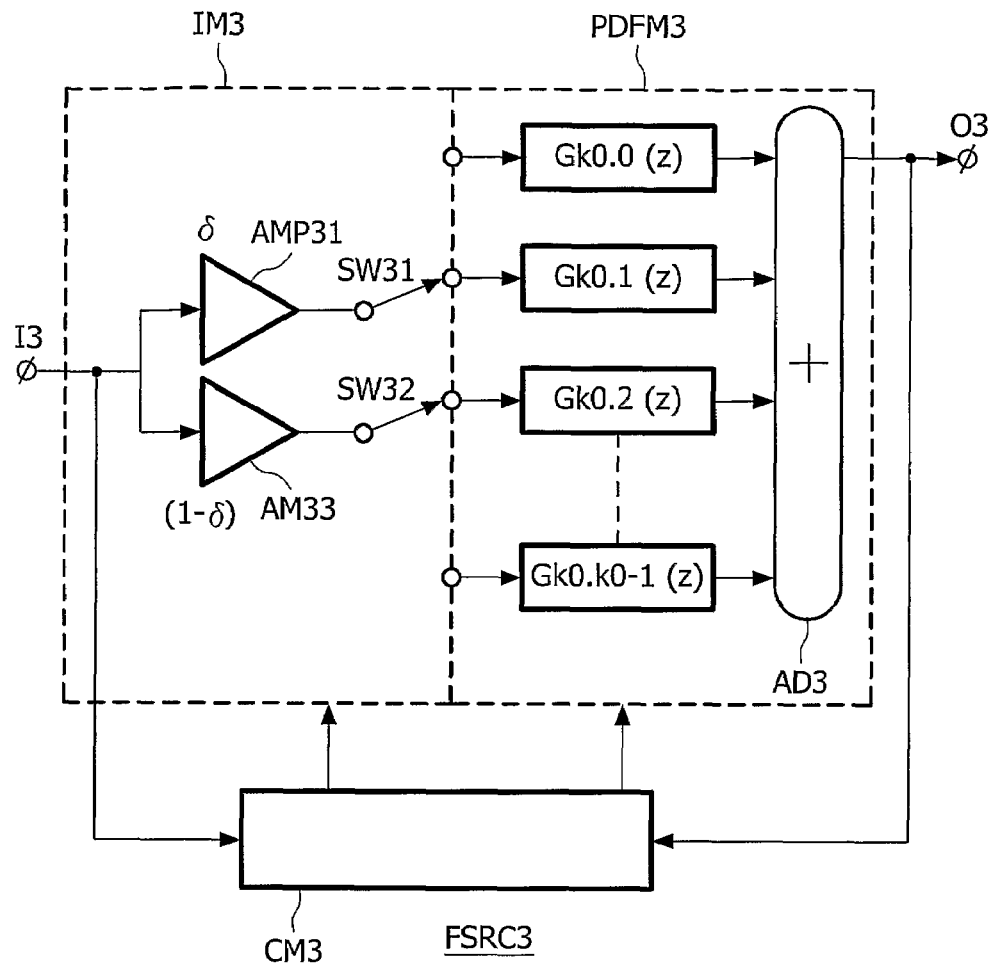

FIG. 4a shows a practical example of an asynchronous sample rate converter as a down-converter FSRC3 having an input I3 and an output O3 which can be used with the present invention. This sample rate converter comprises, logically, a series-arrangement of interpolation means IM3 and polyphase decomposition filter means PDFM3 having Ko branches (Gko,0 (z)-Gko,Ko-1 (z)). Further the sample rate converter comprises control means CM3 for controlling the operation of the interpolation means and the polyphase decomposition filter means. The sample rate converter can be embodied in software, in hardware or in a combination of the two. The term "logically" implies that the physical arrangement does not need to be one after another in space, e.g. if the converter is implemented in software. The circuit elements, e.g. switches, control means, interpolator, amplifiers etc. can be implemented in software, hardware or a combination of the two.

The sample rate converter according to this example, as down-converter, is the transposed version of the sample rate converter up-converter of FIG. 3a. In this way it is possible to use the same sample rate converter for both up- and down-conversion by interchanging the input I3 and the output O3. The man skilled in the art is well aware of the changes to be performed to obtain the transposed circuit.

Figure 4B:
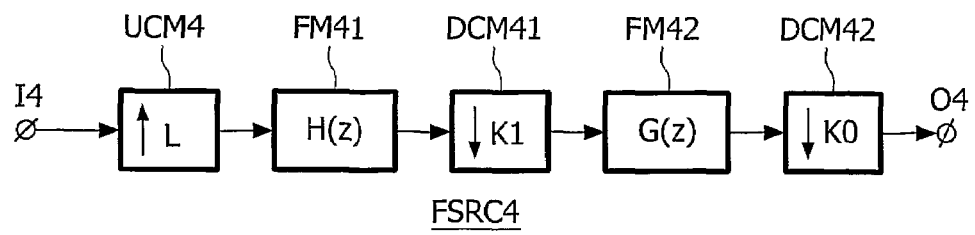

FIG. 4b shows a functional example of an asynchronous sample rate converter as a down-converter FSRC4 which can be used with the present invention. The converter comprises an input I4 and an output O4 and a logical series-arrangement of up-converting means UCM4, first filter means FM41, first down-conversion means DCM41, second filter means FM42 and second down-conversion means DCM42 is placed. The factors can be chosen as required, whereby Ko and Kl are fixed integers and L<=Ko*Kl. The first filter means FM41 can be implemented as a linear interpolator. The sample rate converter can be embodied in software, in hardware or in a combination of the two. The term "logical" implies that the physical arrangement does not need to be one after another in space, e.g. if the converter is implemented in software. The circuit elements, e.g. switches, control means, interpolator, amplifiers etc. can be implemented in software, hardware or a combination of the two.

One aspect of the present invention is the provision of methods and devices that combine a number of srcs so that M input streams, sampled with M sampling clocks can be converted to M output streams sampled M other sampling clocks (an SRCS) running on a digital signal processor (DSP) such that all src's in the system are made independent of each other. The sampling clock of the input will have a different frequency or rate that then of the output clock. There is specific limit on the conversion ratio N, e.g. it maybe less than 1, greater than 1, maybe an integer, a rational number, etc.

Figure 5:
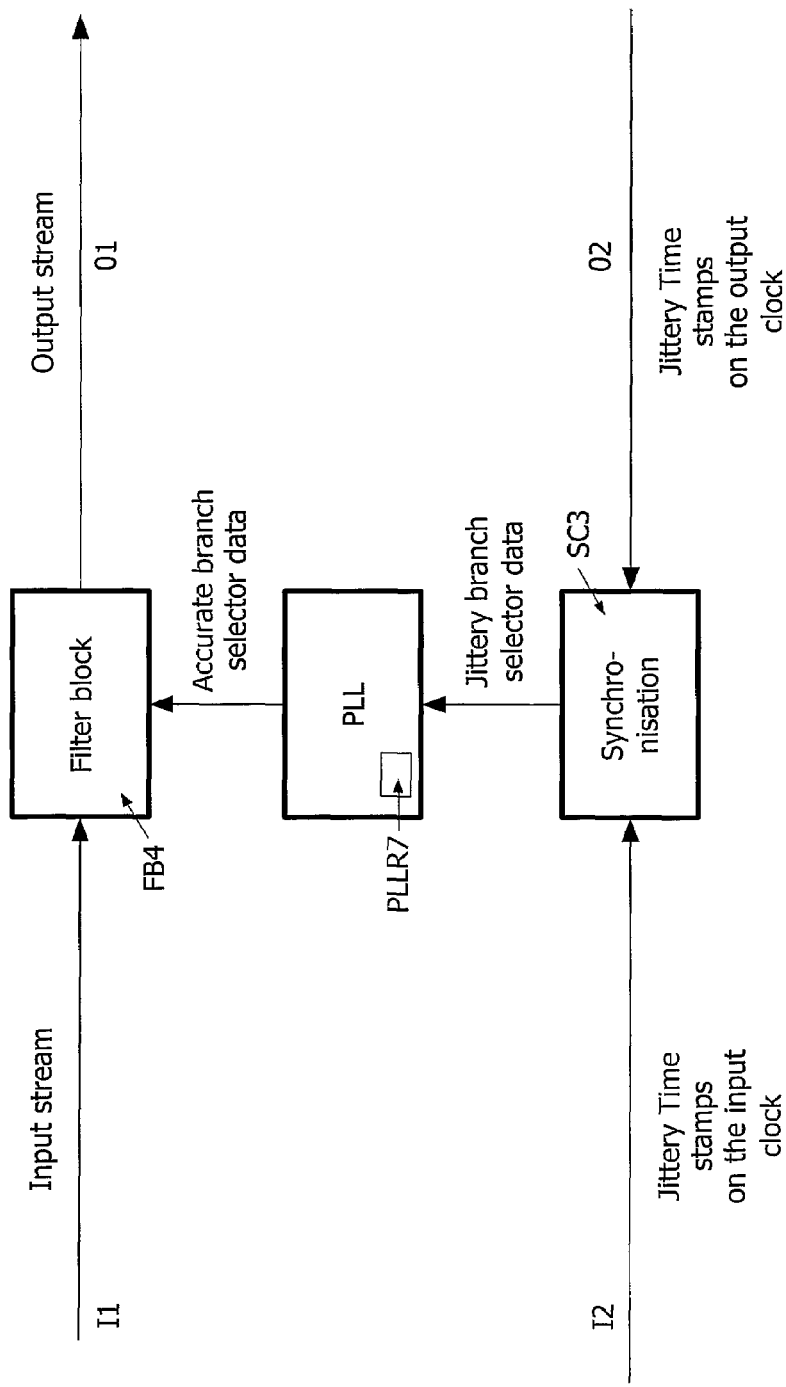
FIG. 5 is a schematic block diagram of a sample rate converter system (SRCS) according to an embodiment of the present invention.

FIG. 5 shows a block diagram of an embodiment of the present invention. FIG. 5 shows an asynchronous src in a system that can combine one or more asynchronous src's so that M input streams, sampled with M sampling clocks can be converted to M output streams sampled by M other sampling clocks (constituting an srcs) running on a digital signal processor (dsp). The input streams may be time discrete input streams. It should be understood that FIG. 5 is a high level block diagram which includes all suitable src's designs within its scope, e.g. the src's depicted in FIGS. 3 and 4. the src's are preferably run independently of each other.

Data input I1 is fed to a polyphase filter means FB4. The polyphase filter means may be implemented in the form of an FIR filter or an Nth-band IIR filter. A synchronization or timing input I2 is fed to a synchronization and control means SC3. The timing input I2 can be a separate timing signal transmitted in parallel with the data signal or may be derived from the data signal. In either case the timing signal is a "native signal", i.e. a jittery signal. On the output side, the data signal O1 is output from the filter block at the output clock rate and an output timing signal O2 can be derived from this data signal. The timing signal O2 is also a "native signal", i.e. a jittery signal. The two PLLs on the input and output jittery time stamps are removed in accordance in this embodiment and instead a jitter removing means is provided for the branch selector data, e.g. a PLL (PLL6) on the branch selector data. A counter will increment at the rate of a clock and every time an arrival or a request for a sample occurs, this counter will be sampled. PLL6 may be implemented as a software PLL. The synchronization and control means SC3 will be executed on the thread with highest sampling rate for this src. This block will amongst other things determine which polyphase branches will have to be calculated in the filter block FB4 and which coefficients will have to be used for the linear interpolation.

Figure 6:
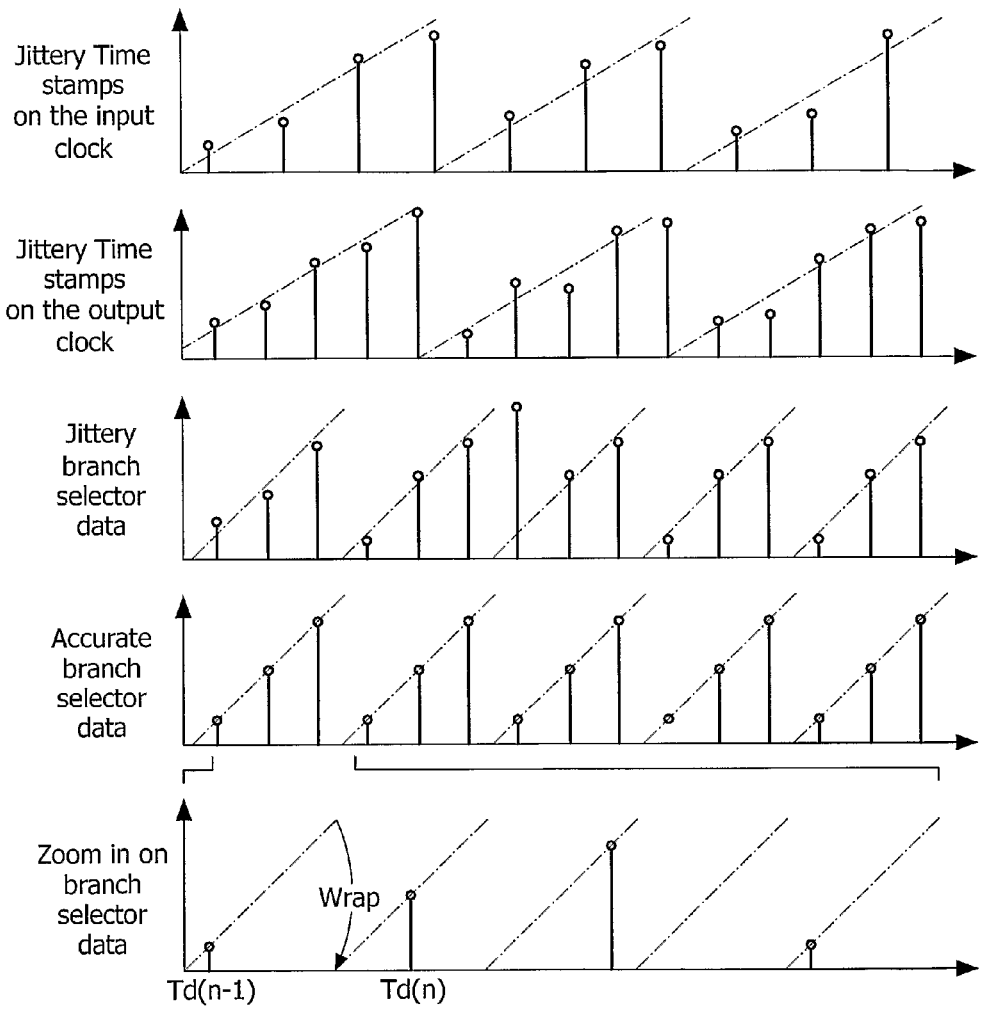
FIG. 6 shows signals in function of time for the system of FIG. 5.

The signals of FIG. 5 are shown in function of the time in FIG. 6. This figure explains how the system works—the input and output signals have jitter but the polyphase branch signals have no or reduced jitter due to the operation of the jitter removing means, e.g. PLL6.

For the accurate operation of the polyphase filter means FB4, an accurate number for the sampling rate conversion factor N is needed—see Eq. 1. This conversion factor is traditionally calculated as:

$$N = \frac{T_{high}}{T_{low}} = \frac{C_{B[n]} - C_{B[n-1]}}{C_{A[m+1]} - C_{A[m]}} = \frac{T_A}{T_B}$$

and where $C_{B[n]} \leq C_{A[m]} \leq C_{B[n+1]}$ and $T_A \geq T_B$ with $T_{high}$=The period of the higher rate sampling clock $T_{low}$=The period of the lower rate sampling clock and where $C_{X[n]}$ is the time of the nth clock pulse on a clock $C_X$ and $T_X$ is the period of the clock $C_X$. But since in this embodiment of the present invention there is no jitter free time stamps data available from the input or the output, it will not be possible to calculate the conversion factor N accurately.

When two clocks have to be synchronized with each other, a signal (S) that can be used is the following:

$$S_{[n]} = \frac{C_{B[n]} - C_{A[m]}}{C_{A[m+1]} - C_{A[m]}}$$

where $C_{B[n]} \leq C_{A[m]} \leq C_{B[n+1]}$ and $T_A \geq T_B$ and where $C_{X[n]}$ is the time of the nth clock pulse on a clock $C_X$ and $T_X$ is the period of the clock $C_X$. The clock $C_X$ can, for example, be the branch data. The signal S is the difference between the time of an occurrence of a clock B and the previous occurrence of a clock A, relative to the period of clock A. S can also be calculated relative to a multiple or a fraction of the period of clock A, or can even be calculated by adding or neglecting C values, depending on the application.

The above equations for N can be rewritten as:

$$\frac{C_{B[n]} - C_{B[n-1]}}{C_{A[m+1]} - C_{A[m]}} = \frac{C_{B[n]} - C_{A[m]}}{C_{A[m+1]} - C_{A[m]}} - \frac{C_{B[n-1]} - C_{A[m]}}{C_{A[m+1]} - C_{A[m]}}$$

$$= S_{[n]} - S_{[n-1]}$$

$$= N$$

The term $S_{[n]}-S_{[n-1]}$ is available in the registers of the PLL for the branch data and does not require a complex calculation. In this aspect of the present invention the conversion factor N can be calculated using the branch selector timing which is jitter-free. $S_{[n]}-S_{[n-1]}$ is available as an accurate number in a PLL register PLLR 7.

This embodiment of the present invention has the following advantages:

The Mips count for processing the SRC is not increased significantly.

The complexity of the software (SW) system will decrease because different src's in a SRC system are no longer related.

In case of a SRCS with only one src, the Mips count will drop because only one PLL is needed.

In the case of a SRCS with multiple output clocks, the Mips count will drop because less PLLs are needed.

The Mips count of the control and synchronization block will drop. Since it is now working on jittery data, it is not needed anymore to calculate everything in full precision, e.g. there is a full 24 bits division in this part of the code that can be replaced by a seven or eight bits precision division.

In the above jitter removing means reduced the jitter on a signal from the synchronization and control block using a PLL. The above is an embodiment of a more general technique as described below.

Generally, the problem is to provide a leveling device and method, i.e. a system that takes jittery data on the input, and produces reduced jitter or jitter free data at the output. Generally, the system will remove high frequency noise from an input signal. A PLL can be used for this, but other devices such as a low pass filter could be used, for example. A PLL is just an example of a "leveling device".

When two clocks have to be synchronized with each other, a signal (S) that can be used is the following:

$$S_{[n]} = \frac{C_{B[n]} - C_{A[m]}}{C_{A[m+1]} - C_{A[m]}}$$

where $C_{B[n]} \leq C_{A[m]} \leq C_{B[n+1]}$ and $T_A \geq T_B$
and where $C_{X[n]}$ is the time of the nth clock pulse on a clock $C_X$ and $T_X$ is the period of the clock $C_X$. The clock $C_X$ can, for example, be the branch data of the embodiment mentioned above or any other clock, e.g. the word clock in an audio link. The signal S is the difference between the time of an occurrence of a clock B and the previous occurrence of a clock A, relative to the period of clock A. S can also be calculated relative to a multiple or a fraction of the period of clock A, or can even be calculated by adding or neglecting C values, depending on the application.

Figure 7:
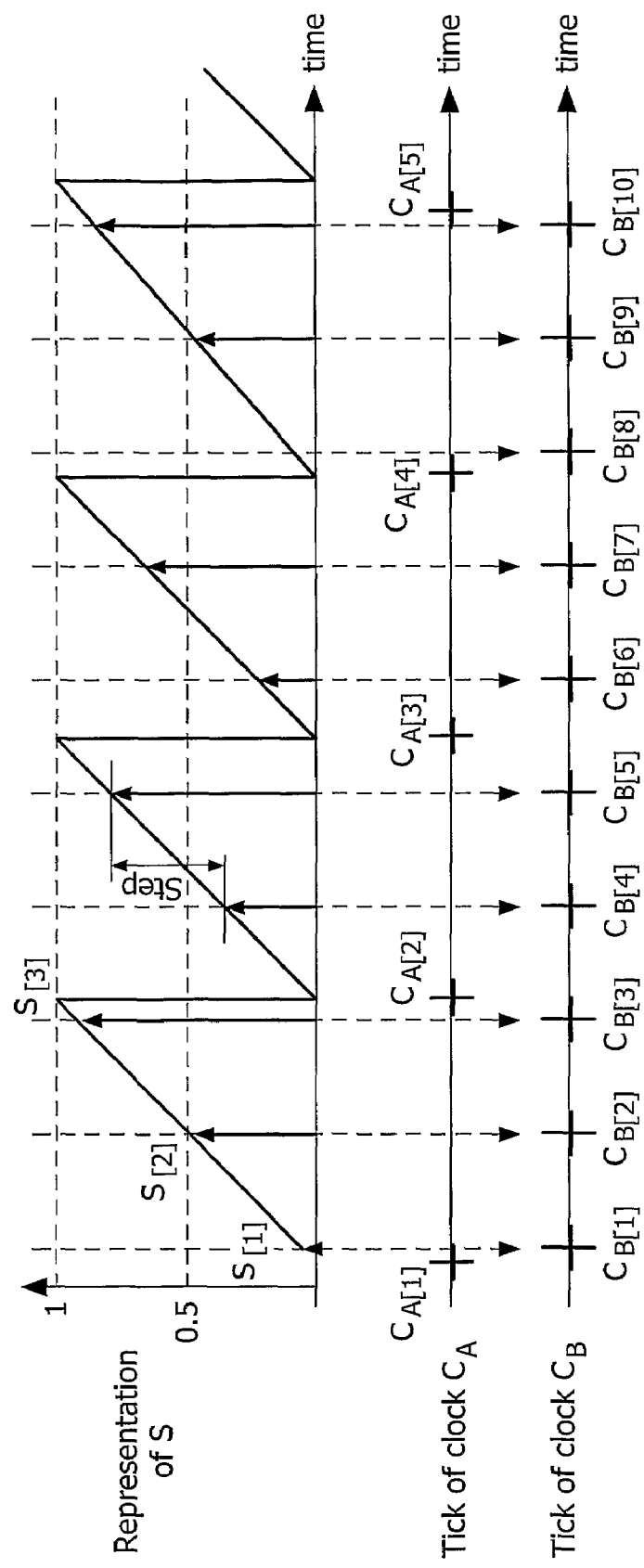
FIG. 7 shows a signal S formed from the difference of clock signals in function of time.

The signal S is represented in FIG. 7. On the bottom of this figure the ticks of clock $C_A$ and $C_B$ in function of the time are shown. On top, the values of S are represented. As can be seen from FIG. 7, the distance between two consecutive values of S is always the same step (calculated modulo between 0 and 1). The values of S need to be known with a very high accuracy, but the time instances $C_{A[x]}$ and $C_{B[x]}$ only have a limited accuracy due to jitter and drift. In a further, independent aspect of the present invention this is solved by applying a leveling algorithm on the values of the signal S. The results of this leveling are clean and equidistant values of the signal S. International Patent Application WO 00/33521 explains how to obtain and how to level the values, without mentioning the novel and inventive features of applying the leveling to the signal S. Only one leveling has to be applied, namely on the S values, instead of two, i.e. on the C values of both clocks. Advantages of all embodiments of the present invention are:

Less Mips required.
Less Power consumed.
Less Memory needed.

The leveling algorithm will have a number of states, because it needs to lock to a certain clock, and this will take some time. If the leveling is done on the C values, these states are properties of the incoming clocks. In the system according to the present invention, this state is a property of the clock synchronization. This reduces the complexity of a system with more than two clocks.

The present invention also includes software for executing on a suitable processing engine such as a microprocessor or a Programmable Gate Array such as an FPGA. The processing engine may be embedded. The software includes code segments which when executed on the processing engine implement any of the methods of the present invention. The software contains code segments which when executed convert an input time discrete, e.g. digital signal with an input sampling rate to an output signal having an output sampling rate. The software contains code segments which when executed process a received jittery input timing signal and an output timing signal. The software includes code segments which when executed on the processing engine provide polyphase filtering of the input data signal to generate output samples for the output signal. The software includes code segments which when executed on the processing engine provide polyphase branch selector data for the polyphase filtering step, and reduce jitter only in the polyphase branch selector data. The jitter reducing step in the polyphase branch selector data includes regularizing the polyphase branch selector data using a phase-locked loop also implemented in software. Alternatively, the software may include code segments which when executed reduce jitter in the polyphase branch selector data by leveling a difference signal between the input timing signal and the output timing signal. Code segments of the software when executed calculate a conversion ratio, which is the ratio of the output to the input sampling rate, from the polyphase branch data. Calculating the conversion ratio N may be performed according to:

$$N = S_{[n]} - S_{[n-1]}.$$

The software may also include code which when executed on a processing engine perform a method of sample rate converting a number of M input streams, sampled with M sampling clocks to M output streams sampled with M other sampling clocks, the method comprising:

receiving at least one jittery input timing signal and at least one output timing signal, receiving an input time discrete, e.g. digital signal and polyphase filtering the input signal and outputting samples for the output signal, providing the polyphase filtering step with polyphase branch selector data, receiving the jittery input timing signal and the output timing signal and reducing jitter only in the polyphase branch selector data. The sample rate conversion of each input stream is preferably independent of the conversion of all the other conversions.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An apparatus for converting an input time discrete signal with an input sampling rate to an output signal having an output sampling rate, the conversion ratio being N, the conversion ratio being the ratio of the output to the input sampling rate, the apparatus receiving a jittery input timing signal comprising:
    polyphase filter means receiving the input signal and for outputting samples for the output signal,
    control means receiving the jittery input timing signal and an output timing signal and for providing the filter means with polyphase branch selector data, and
    means for reducing jitter in the polyphase branch selector data.

2. The apparatus according to claim 1, wherein the means for reducing jitter in the polyphase branch selector data includes a phase-locked loop.

3. The apparatus according to claim 1, wherein the means for reducing jitter (PLL6) in the polyphase branch selector data includes a means for leveling a difference signal between the input timing signal and the output timing signal.

4. The apparatus according to claim 1, the apparatus having means for determining the conversion ratio from the polyphase branch data, and wherein the means for reducing jitter reduces jitter only in the polyphase branch selector data.

5. The apparatus according to claim 1, wherein the apparatus is implemented in software running on a processing engine.

6. An apparatus to convert an input time discrete signal having an input sampling rate to an output signal having an output sampling rate, at a conversion ratio N of the output to the input sampling rate, the apparatus comprising:
    a polyphase filter to receive the input signal and to output samples for the output signal;
    a controller to receive a jittery input timing signal and an output timing signal, and to provide the filter with polyphase branch selector data; and
    a reducer to reduce jitter in the polyphase branch selector data; and
    a converter arrangement to determine the conversion ratio N according to
    $N = S_{[n]} - S_{[n-1]}$, and $$S_{[n]} = \frac{C_{B[n]} - C_{A[m]}}{C_{A[m+1]} - C_{A[m]}},$$

where
    $C_{B[n]} \leq C_{A[m]} \leq C_{B[n+1]}$ and $T_A \geq T_B$ and where $C_{X[n]}$ is the time of the nth clock pulse on a clock $C_X$ and $T_X$ is the period of the clock $C_X$.

7. An apparatus for sample rate converting a number of M input streams, sampled with M sampling clocks to M output streams sampled with M other sampling clocks, the conversion ratio being N, the conversion ratio being the ratio of the output to the input sampling rate, the apparatus receiving at least one jittery input timing signal, comprising: polyphase filter means receiving an input time discrete signal and for outputting samples for the output signal, control means receiving the jittery input timing signal and an output timing signal and for providing the filter means with polyphase branch selector data, and means (PLL6) for reducing jitter in the polyphase branch selector data.

8. The apparatus according to claim 7, running on a digital signal processor.

9. The apparatus according to claim 7, wherein the sample rate conversion of each input stream is independent of the conversion of all the other conversions.

10. The apparatus according to claim 7, wherein the means for reducing jitter in the polyphase branch selector data includes a phase-locked loop.

11. The apparatus according to claim 7, wherein the means for reducing jitter in the polyphase branch selector data includes a means for leveling a difference signal between the input timing signal and the output timing signal.

12. The apparatus according to claim 7, the apparatus having means for determining the conversion ratio from the polyphase branch data.

13. The apparatus according to claim 7, wherein the means for determining the conversion ratio N determines according to:

$N = S_{[n]} - S_{[n-1]}$ and $$S_{[n]} = \frac{C_{B[n]} - C_{A[m]}}{C_{A[m+1]} - C_{A[m]}}$$

where $C_{B[n]} \leq C_{A[m]} \leq C_{B[n+1]}$ and $T_A \geq T_B$ and where $C_{X[n]}$ is the time of the nth clock pulse on a clock $C_X$ and $T_X$ is the period of the clock $C_X$.

14. A method of converting an input time discrete signal with an input sampling rate to an output signal having an output sampling rate, the conversion ratio being N, the conversion ratio being the ratio of the output to the input sampling rate, the method comprising:
    receiving a jittery input timing signal and an output timing signal,
    receiving the input time discrete signal,
    polyphase filtering the input data signal to output samples for the output signal,
    providing polyphase branch selector data for the polyphase filtering step, and
    reducing jitter in the polyphase branch selector data.

15. The method according to claim 14, wherein reducing jitter in the polyphase branch selector data includes regularizing the polyphase branch selector data using a phase-locked loop.

16. The method according to claim 14, wherein reducing jitter in the polyphase branch selector data includes leveling a difference signal between the input timing signal and the output timing signal.

17. The method according to claim 14, further comprising determining the conversion ratio from the polyphase branch data, and wherein the step of reducing jitter includes reducing jitter only in the polyphase branch selector data.

18. The method according to claim 14, further comprising determining the conversion ratio N according to $N = S_{[n]} - S_{[n-1]}$ and $$S_{[n]} = \frac{C_{B[n]} - C_{A[m]}}{C_{A[m+1]} - C_{A[m]}}$$

where $C_{B[n]} \leq C_{A[m]} \leq C_{B[n+1]}$ and $T_A \geq T_B$ and where $C_{X[n]}$ is the time of the nth clock pulse on a clock $C_X$ and $T_X$ is the period of the clock $C_X$.

19. A method of sample rate converting a number of M input streams, sampled with M sampling clocks to M output streams sampled with M other sampling clocks, the conversion ratio being N, the conversion ratio being the ratio of the output to the input sampling rate, the method comprising:

receiving at least one jittery input timing signal and at least one output timing signal, receiving an input time discrete signal and polyphase filtering the input signal and outputting samples for the output signal, providing the polyphase filtering step with polyphase branch selector data, receiving the jittery input timing signal and the output timing signal and reducing jitter in the polyphase branch selector data.

20. The method according to claim 19, wherein the sample rate conversion of each input stream is independent of the conversion of all the other conversions.

* * * * *